United States Patent [19]

Murrmann et al.

[11] 4,323,913
[45] Apr. 6, 1982

[54] INTEGRATED SEMICONDUCTOR CIRCUIT ARRANGEMENT

[75] Inventors: Helmuth Murrmann, Ottobrunn; Ronald Rathbone, Taufkirchen; Ulrich Schwabe, Munich, all of Fed. Rep. of Germany

[73] Assignee: Siemens Aktiengesellschaft, Berlin & Munich, Fed. Rep. of Germany

[21] Appl. No.: 85,735

[22] Filed: Oct. 17, 1979

Related U.S. Application Data

[63] Continuation of Ser. No. 867,429, Jan. 9, 1978, abandoned, which is a continuation of Ser. No. 664,872, Mar. 8, 1976, abandoned.

[30] Foreign Application Priority Data

Mar. 11, 1975 [DE] Fed. Rep. of Germany ....... 2510593

[51] Int. Cl.³ .................. H01L 27/04; H01C 7/00
[52] U.S. Cl. ..................... 357/51; 148/175; 357/36; 357/46; 357/50; 357/52; 365/179
[58] Field of Search ............ 357/50, 51, 48, 52; 338/306, 307

[56] References Cited

U.S. PATENT DOCUMENTS

| | | | |
|---|---|---|---|
| 3,631,311 | 12/1971 | Engbert | 357/51 |
| 3,648,125 | 3/1972 | Peltzer | 357/50 |
| 3,911,471 | 10/1975 | Kooi et al. | 357/50 |
| 3,961,356 | 6/1976 | Kooi | 357/50 |
| 3,962,717 | 6/1976 | O'Brien | 357/50 |

OTHER PUBLICATIONS

Wiedmann, IBM Tech. Discl. Bulletin, vol. 13, No. 9, Feb. 1971, p. 2469, (357-51).
Evans et al, IEEE J. of Solid–State Circuits, vol. SC 8, No. 5, Oct. 1973, pp. 373-374.

*Primary Examiner*—William D. Larkins
*Attorney, Agent, or Firm*—Hill, Van Santen, Steadman, Chiara & Simpson

[57] ABSTRACT

An integrated semiconductor circuit arrangement is provided which comprises a substrate of semiconductor material of one conductivity type, an epitaxial layer of the opposite conductivity type formed on one major surface of the substrate, the epitaxial layer having function elements such as transistors, diodes, resistances, and so forth, formed therein. A least some of these function elements are located in insulated regions provided for them which in the boundary area between the substrate and the epitaxial layer are bounded by a pn junction and which at right angles to this boundary area are bounded by oxide walls which extend through the epitaxial layer to the substrate. The oxide walls are surrounded by a resistor region of the said one conductivity type which extends through the epitaxial layer to the substrate.

2 Claims, 12 Drawing Figures

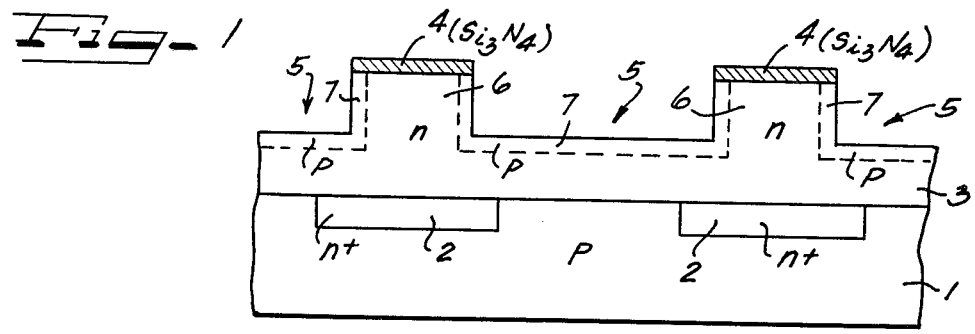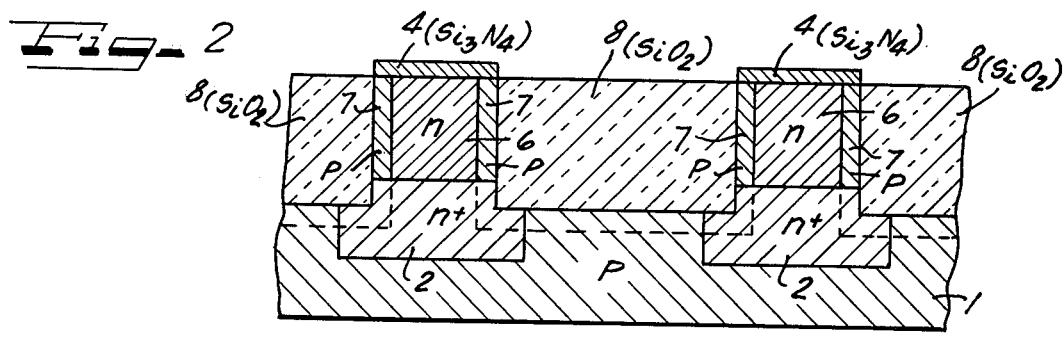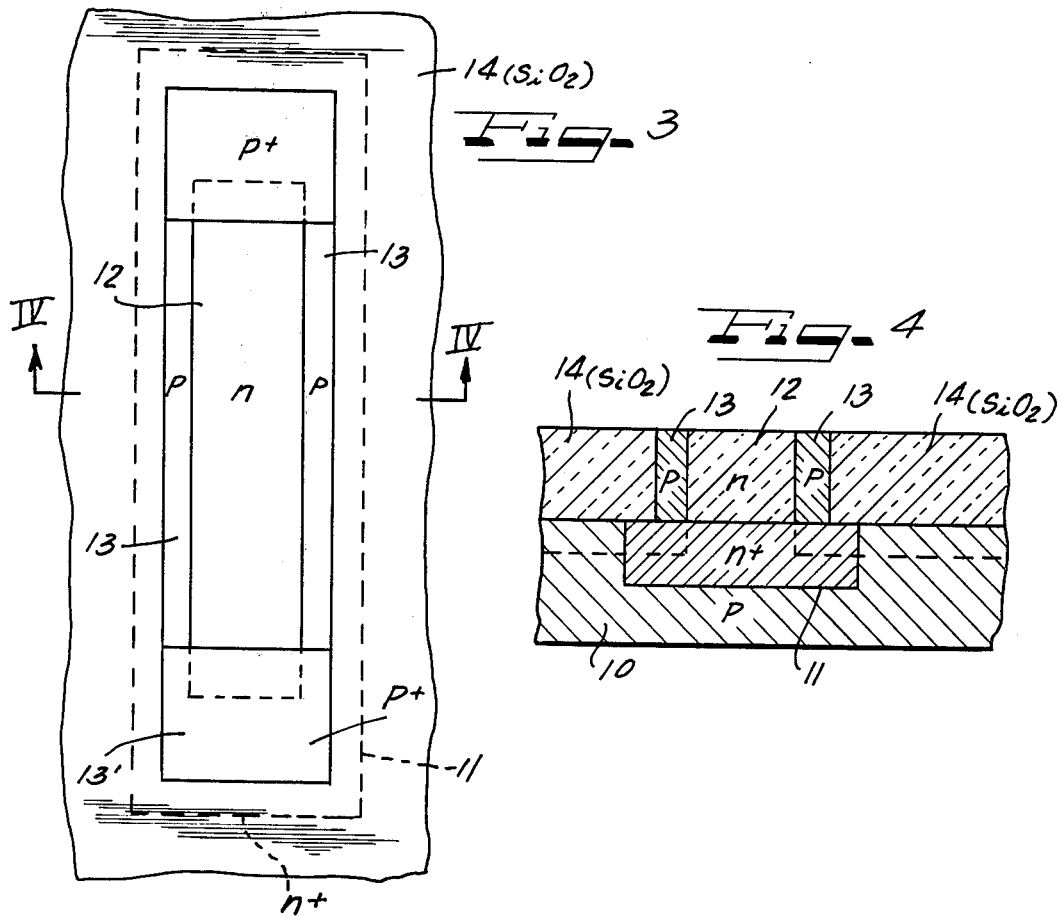

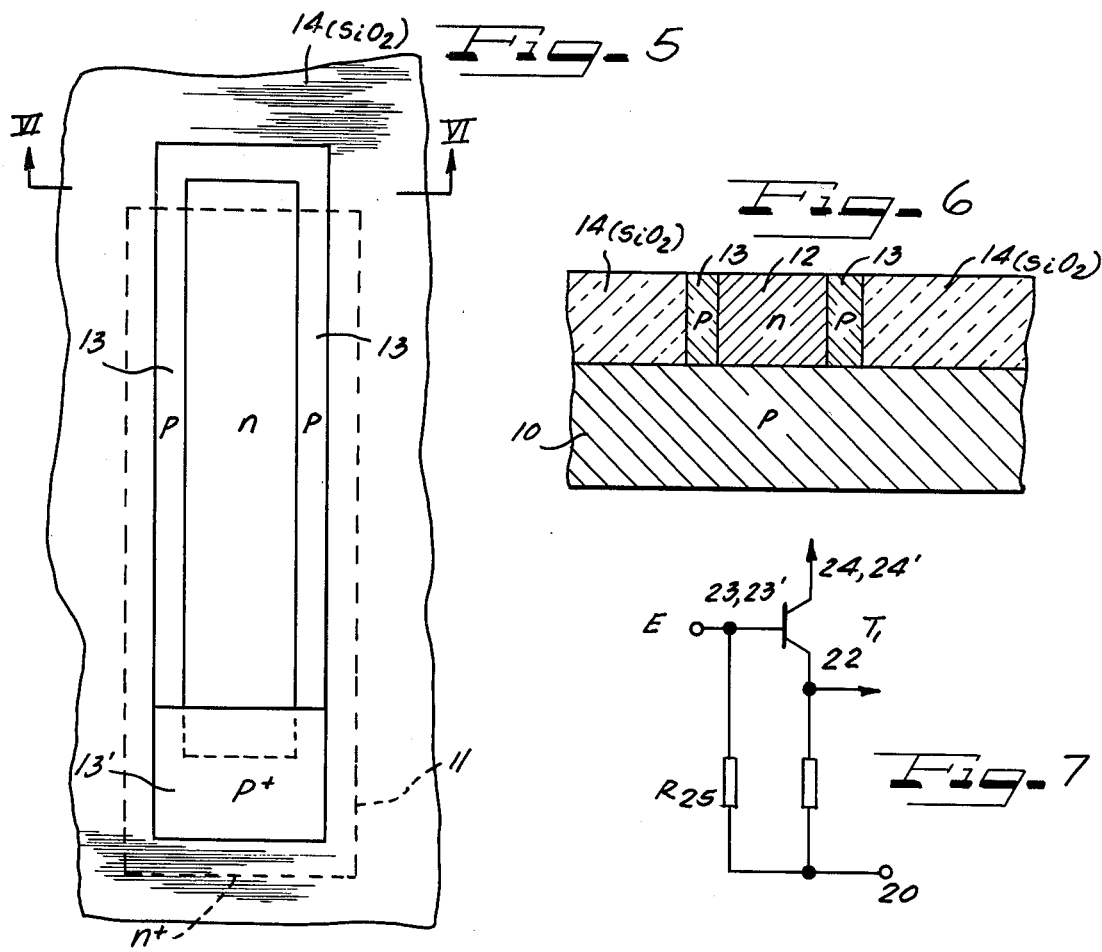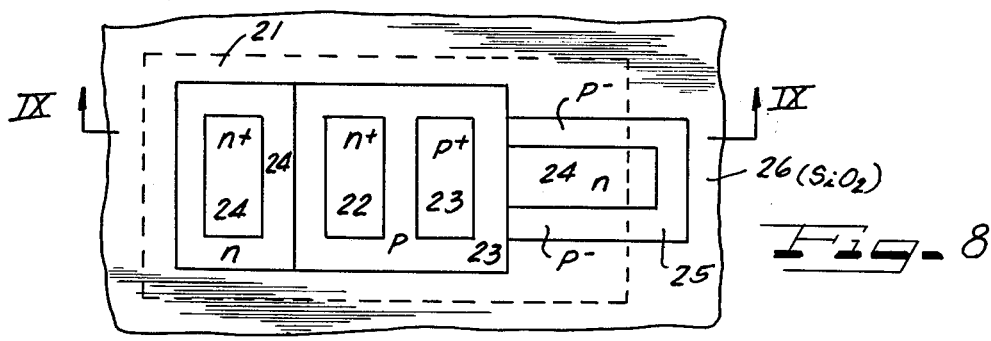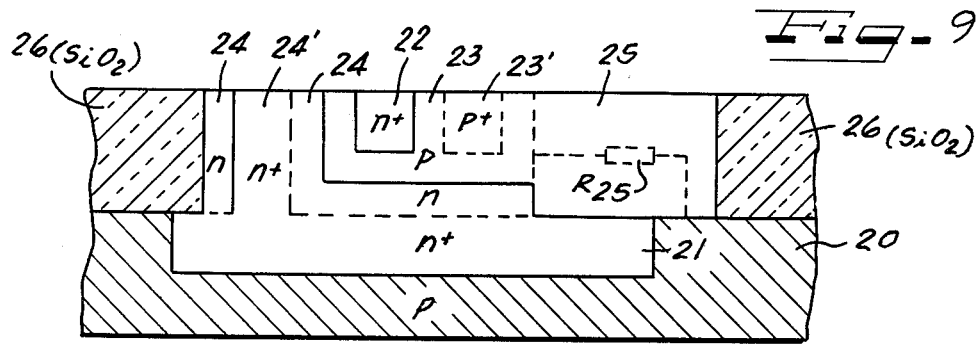

INTEGRATED SEMICONDUCTOR CIRCUIT ARRANGEMENT

This is a continuation of application Ser. No. 867,429, filed Jan. 9, 1978 which is a continuation of application Ser. No. 664,872 filed March 8, 1976 both now abandoned.

BACKGROUND OF THE INVENTION

The field of the present invention is integrated circuits in which a number of function elements are located in the semiconductor body. One problem in connection with the fabrication of integrated circuits lies in the provision of adequate means for isolating various function elements from each other except where electrical connections are required for the circuit. It is important also that the arrangement of the components of the integrated circuit be such that it minimizes production costs.

It is known that a substrate of one conductivity may have diffused in a surface portion thereof a heavily doped region of the opposite impurity type and to thereafter form an epitaxial layer of the opposite impurity type having relatively low doping on this substrate. The region of the opposite conductivity type which was initially diffused into the surface of the substrate then upwardly diffuses into a confronting portion of the epitaxial layer. This provides a heavily doped buried layer located partially in the substrate and partially in the epitaxial layer. Function elements can then be formed in the epitaxial layer adjacent the outer surface of the epitaxial layer. Such an arrangement is shown and described, for example, in Shannon, U.S. Pat. No. 3,761,319, issued Sept. 25, 1973.

In bipolar integrated circuits normally the function elements are electrically insulated from one another by special insulation-diffusion.

An integrated circuit of this type can, for example, be designed in such a manner that on to a p-doped substrate is deposited an n-type epitaxial layer whose surface is subsequently transformed into an oxide layer. Conventional photolithographic methods are used to etch frame-like structures into this oxide layer, through which a p+ diffusion (p+ indicates a high doping concentration) is effected to a depth at which the diffusion front overlaps with the p-doping of the substrate. In this way n-bodies are obtained which are entirely enclosed by a pn-junction. When the p-substrate and the p+ insulating frames are connected to the most negative potential, all the insulating-pn-junctions are poled in the blocking direction.

Depth diffusion inevitably involves a lateral diffusion beneath the oxide mask so that the subsequently diffused zones of the function elements, e.g., the p-base zones of npn-transistors, must always possess a sufficient distance from the insulating zone. This safety clearance is determined by the diffusion depths, adjustment tolerances and space charge zones. Therefore, the space requirement, for example of a transistor, is substantially dependent upon the area of space required for the insulation.

To avoid this disadvantage, the so-called isoplanar technique has become known. In this technique a thin silicon nitride layer is applied to the surface of the epitaxial layer and is structure-etched by means of known processes. The remaining nitride structures serve as mask for the etching of frame-like zones in the epitaxial layer with an etching depth of approximately half the thickness of the epitaxial layer. During a subsequent oxidation process, the exposed silicon in the etching trenches is locally transformed into silicon dioxide, the zones beneath the nitride layer remaining unaltered by the effects of the nitride, which latter has a masking action vis-a-vis oxygen. The oxidation is continued until the oxide boundary has passed the pn-junction between epitaxial layer and substrate. As a result, beneath the nitride remain islands which are insulated from the substrate by a pn-junction and form oxide frames with their lateral boundaries.

An insulation technique of this type offers the following advantages:
(a) The lateral dimensions of the silicon dioxide-insulating frames are comparable with or smaller than the corresponding widths of diffused p-frames in the diffusion-insulation technique.
(b) The safety clearances between the diffusions (e.g., base and collector of a transistor) can theoretically be dispensed with, i.e., the diffusions can be taken right up to the oxide boundaries. In this case, adjustment tolerances are of no importance;
(c) The side wall capacitances of the bodies are considerably reduced;
(d) Photo lacquer—or mask errors which occur in the oxide-insulation zones are ineffective as a result of the greater oxide thickness.

These advantages are counteracted by a series of important disadvantages and problems:
(a) The oxidation is limited to a technology with a small epitaxial thickness as otherwise the requisite oxide thicknesses and the times required for the production thereof become unviably great.
(b) During the oxidation buried-layer zones which have diffused-in prior to the epitaxy usually are diffused into the epitaxial layer and accordingly impose a lower limit for the epitaxy thickness.
(c) At the surface of the boundary between silicon/silicon dioxide round beads are formed, the height and shape of which are heavily dependent upon the oxide thickness and the profile of the trench etching. The topology at this "flat" surface represents a problem for the arrangement of conductor paths and generally speaking for the photo-lacquer layers in the planar process.
(d) With the forms of doping conventionally employed for the substrate material, beneath the oxide of the insulating zones form inversion layers which render the insulation between individual bodies incomplete due to channel formation. Although this effect can be counteracted by increasing the substrate doping, this would in turn increase the base capacitance of the bodies.

SUMMARY OF THE INVENTION

It is an object of the present invention to provide an integrated semiconductor circuit arrangement in which many of the disadvantages mentioned above are avoided, particularly those listed under (d) above. This object is achieved in an integrated semiconductor circuit arrangement of the type described in the introduction, in accordance with the invention in that the insulating oxide walls are surrounded by zones of the one conductivity type which extend through the epitaxial layer up to the substrate.

A further object of the present invention is to provide zones which surround the insulating oxide walls, which zones serve as resistance elements in the circuit arrangement.

In a process for the production of an integrated circuit arrangement of the above defined type, in a further development of the invention, it is provided that after the production of trenches, in order to produce the insulating oxide walls, zones possessing the opposite conductivity type to the epitaxial layer are diffused into the epitaxial layer to a depth which ensures that the diffused-in zones will diffuse out into the substrate during a subsequent temperature treatment for the oxide production.

BRIEF DESCRIPTION OF THE DRAWINGS

FIG. 1 is a fragmentary diagrammatic view illustrating one stage in the fabrication of a portion of an integrated circuit embodying the present invention;

FIG. 2 is a view similar to FIG. 1 illustrating a later stage in the fabrication process;

FIG. 3 shows a portion of an integrated semiconductor circuit arrangement in a plan view with a zone surrounding the insulating walls for use as a resistance;

FIG. 4 is a fragmentary vertical sectional view of the arrangement shown in FIG. 3 taken along the line IV—IV of FIG. 3;

FIG. 5 is a portion of a plan view which shows another embodiment of the present invention and illustrates how a zone may be used as a resistance and which surrounds the oxidation walls, the impurity concentration of the gap in part being different from that shown in FIG. 3;

FIG. 6 is a vertical sectional view of the structure shown in FIG. 5, taken along the line VI—VI of FIG. 5;

FIG. 7 is a partial circuit diagram of a transistor stage which can be used, for example, as an input stage of an ECL gate;

FIG. 8 is a sectional plan view of an embodiment of the present invention including the sub-circuit shown in FIG. 7;

FIG. 9 is a vertical sectional view of the structure shown in FIG. 8;

DESCRIPTION OF THE PREFERRED EMBODIMENTS

Figure 10:
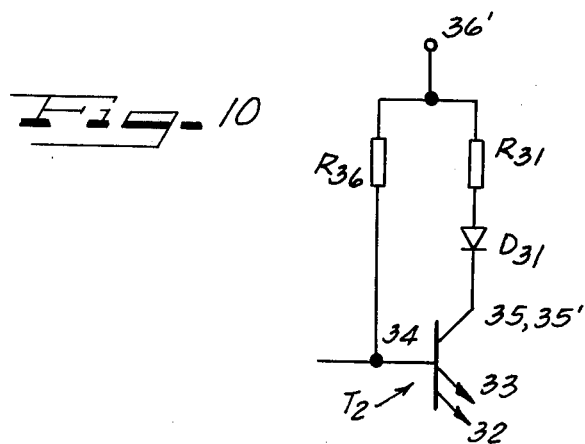
FIG. 10 is a partial circuit diagram of a transistor stage which may be used, for example, in a monolithic storage cell.

In accordance with FIG. 1, in a p type semiconductor substrate 1 are arranged two highly doped n+ type layer zones 2 and upon the substrate an n type epitaxy layer 3 is formed. Into this structure are etched trenches 5 which are to serve for the formation of insulating-oxide walls. On remaining islands 6 of the epitaxial layer 3 are located silicon nitride layers ($Si_3N_4$) 4 which have protected the remaining islands 6 from attack during the etching of the trenches 5.

Following the production of the trenches, a p-zone 7 is diffused into the remaining structure of the epitaxial layer 3. As, during subsequent temperature treatments, the diffusion fronts of these zones 7 advance further, their boundaries are illustrated by broken lines.

FIG. 2 shows the arrangement shown in FIG. 1 following the production of insulating walls 8 consisting of silicon dioxide ($SiO_2$). It can be seen from FIG. 2 that as a result of the temperature treatment for the production of the insulating oxide walls 8, the zones 7 diffuse out into the substrate 1, and that in addition during the temperature treatment the diffusion fronts of the buried-layer zones 2 have advanced so that they penetrate more deeply into the substrate 1 and into the islands 6.

FIG. 2 also shows that the p-zones 7 surround the oxide insulating walls 8, as a result of which, it is no longer possible for inversion layers to form beneath the insulating oxide, which would lead to a channel formation and thus to an inadequate insulation of the individual islands and insulating bodies 6.

At this point it should be noted that the illustrations in FIGS. 1 and 2 are merely schematic in order to indicate the principle of the invention and are not drawn to scale. The actual shape of diffusion fronts and also of the etching trenches is well known in the semiconductor technique and therefore does not need to be illustrated in detail. This also applies to the exemplary embodiments which are to be explained in the following.

FIGS. 3 and 4 show an embodiment of the invention in which a zone of the same type as the zone 7 in FIGS. 1 and 2 is used as resistance.

In this embodiment an n-conducting insulated region is insulated all around by insulating oxide walls 14 and by a pn-junction between a buried-layer-zone 11 and a p-conducting substrate 10. Also in this embodiment, the oxide walls 14 are surrounded by p-zones 13. It can be seen from FIG. 3 that the zones 13 can be contacted via p+ end zones 13', so that they can be used as a resistance. The zone 13, with its end zones 13', laterally enclose the insulating body 12 all around in this embodiment, while the buried-layer zone 11 completes the enclosure all around beyond the zone 13, and its end regions 13'. The formation of a resistance in this way provides a series of advantages:

As the resistance zones are highly ohmic p-zones 13, for a set doping, a higher resistance value can be achieved in comparison to n-resistances, as the hole conductivity is lower than the electron conductivity. In addition, the production of the resistance requires no other process step as it is formed simultaneously to the channel stop diffusion. On account of the structure represented in FIGS. 3 and 4, the resistance is also independent of mask tolerances and its space requirement is also relatively small.

In the embodiment shown in FIGS. 3 and 4, the resistance is electrically accessible via the end regions 13' on the side facing away from the substrate 10.

In a further development of the invention, however, the resistance can also be connected via the substrate. An embodiment of this type is shown in FIGS. 5 and 6, in which elements corresponding to FIGS. 3 and 4 have been provided with identical references.

In this embodiment, the buried-layer-zone 11 does not completely surround the resistance zone 13, so that in its upper end region in FIG. 5, this zone is in direct electric contact with the substrate 10.

FIGS. 7 to 9 show another embodiment of the invention, in which a resistance of the above-described type is arranged in the input path of a transistor $T_1$. This resistance $R_{25}$ is connected to the base of the transistor $T_i$, the base of which forming an input E of the stage, and is likewise connected to a terminal 20 which in the integrated design shown in FIGS. 8 and 9 is formed by the substrate. A resistance (not designated in detail) located in the emitter arm of the transistor $T_1$ is not integrated into the integrated design in FIGS. 8 and 9.

The integrated structure shown in FIGS. 8 and 9 also comprises a substrate 20, a buried-layer-zone 21 and an insulated region 24 insulated by means of oxide insulating walls 26 and by a p-zone 25. In this insulated region, the transistor $T_1$ is formed by a region of the insulating body 24 as collector, a p-zone as base with a base-contact zone 23', and an n+ zone 22 as emitter. An n+ zone 24' serves as collector terminal zone.

In accordance with the embodiment shown in FIGS. 8 and 9, the p-zone 25 forms the resistance $R_{25}$ which is connected on the one hand to the base zone 23 and, on the other hand, to the substrate 20.

Figure 11:
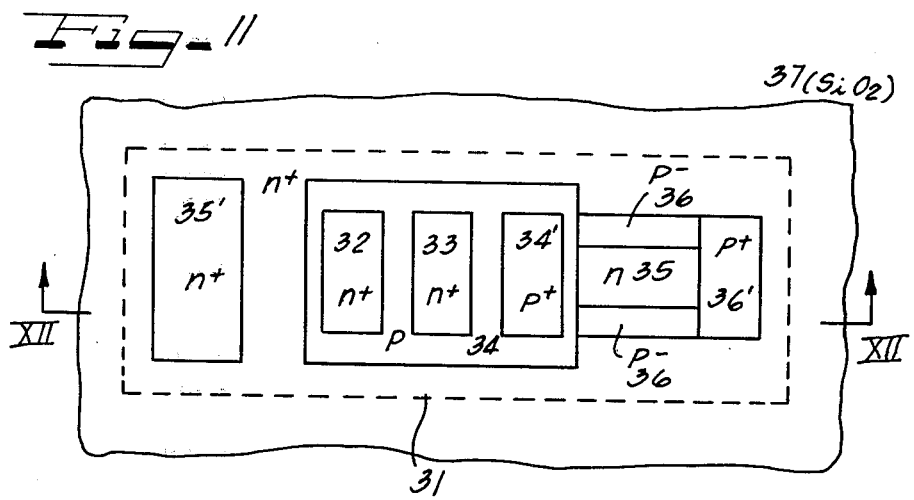
FIG. 11 is a plan view of a portion of an integrated circuit which includes the design of the sub-circuit shown in FIG. 10.
Figure 12:
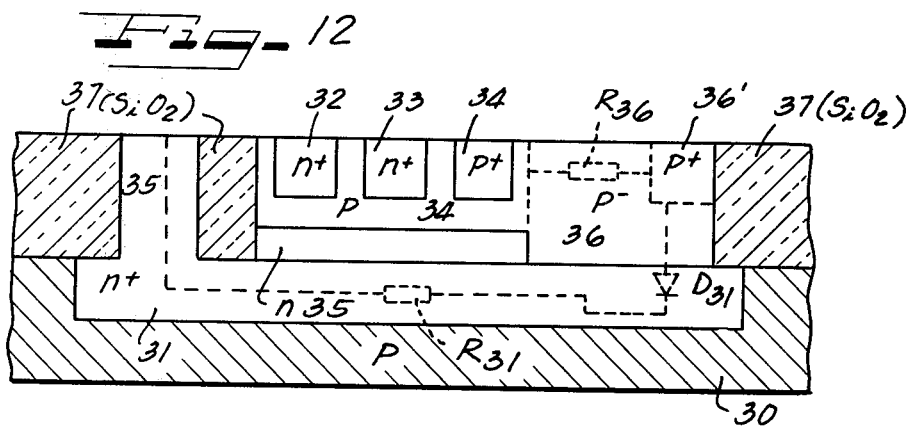
FIG. 12 is a vertical sectional view of FIG. 11 taken along the line XII—XII of FIG. 11.

FIGS. 10 to 12 show another embodiment of a transistor stage which can be used as multi-emitter stage in a monolithic storage cell. A storage cell of this type is described in full, for example, in the German Application No. 1,774,929, laid open for public inspection.

The transistor stage contains a multi-emitter transistor $T_2$ with a series connection of a resistor $R_{31}$ and a diode $D_{31}$ in the collector circuit and a resistor $R_{36}$ as base resistance. At a terminal 36', the stage can be supplied with an operating voltage.

In accordance with FIGS. 11 and 12, here too the integrated structure is formed by a p-substrate 30, a buried-layer-zone 31 and an insulating body 35 insulated by oxide insulating walls 37 and a p$^-$ zone 36. The transistor $T_2$ is formed by the n-insulating body 35 as collector, a p-zone 34 as base with a p+ base terminal zone 34' and n+ zones 32 and 33 as emitters.

In this embodiment, the p$^-$ zone 36 possesses a contact terminal zone 36'. Thus, the zone 36 forms the resistance $R_{36}$ between base 34 of the transistor $T_2$ and the terminal 36'. The pn-junction between the p$^-$ zone 36 and the buried-layer-zone 31 forms the diode $D_{31}$ which lies in series with the path resistance of the buried-layer-zone 31 as resistance $R_{31}$.

It will be apparent to those skilled in the art that many modifications and variations may be effected without departing from the spirit and scope of the novel concepts of the present invention.

We claim as our invention:

1. An integrated semiconductor circuit arrangement comprising: a semiconductor substrate of a first conductivity type; a semiconductor epitaxial layer of a second conductivity type on one surface of said substrate; oxide walls extending through said epitaxial layer to said substrate separating said epitaxial layer into isolated sections;
   at least one of said isolated sections having spaced generally parallel sidewalls terminating in spaced end walls; first and second regions of said first conductivity type lining said oxide walls along said generally parallel sidewalls;
   a third region of said first conductivity type located at one of said end walls, said third region having a lower resistivity than said first and second regions and being in electrical contact with said first and second regions; means of said first conductivity type in contact with said first and second regions at the one of said end walls spaced from said third region; and
   said first and second regions being separated from each other by the second conductivity type material of said at least one of said isolated sections except at said end walls,
   whereby said first and second regions form a resistor element between said means in contact therewith and said third region.

2. An integrated semiconductor circuit arrangement comprising:
   a semiconductor substrate of a first conductivity type;
   a semiconductor epitaxial layer of a second conductivity type on one surface of said substrate;
   oxide walls extending through said epitaxial layer to said substrate separating said epitaxial layer into isolated sections;
   at least one of said isolated sections being elongate and having spaced generally parallel sidewalls terminating in spaced end walls;
   first and second regions of said first conductivity type lining said oxide walls along said generally parallel sidewalls; a third region of said first conductivity type located at one of said end walls, said third region having a lower resistivity than said first and second regions and being in electrical contact with said first and second regions; means of said first conductivity type in contact with said first and second regions at the one of said end walls spaced from said third region; and
   said first and second regions being separated from each other by the second conductivity type of material of said at least one of said elongated sections except at said end walls,
   whereby said first and second regions form a resistor element between said means in contact therewith and said third region.

* * * * *